United States Patent
Babin

[19]

[11] Patent Number: 5,941,974
[45] Date of Patent: Aug. 24, 1999

[54] SERIAL INTERFACE WITH REGISTER SELECTION WHICH USES CLOCK COUNTING, CHIP SELECT PULSING, AND NO ADDRESS BITS

[75] Inventor: David Cyrille Babin, Austin, Tex.

[73] Assignee: Motorola, Inc., Schaumburg, Ill.

[21] Appl. No.: 08/757,606

[22] Filed: Nov. 29, 1996

[51] Int. Cl.[6] .................................................. G06F 12/02
[52] U.S. Cl. .............................. 710/130; 711/5; 711/103; 711/220; 326/39; 365/230.03
[58] Field of Search ..................... 711/148, 173, 711/129, 211, 109, 5, 103, 171, 220; 395/310; 326/39, 40; 365/230.03

[56] References Cited

U.S. PATENT DOCUMENTS

| | | | |
|---|---|---|---|
| 5,157,342 | 10/1992 | Atwood et al. | 328/155 |
| 5,530,911 | 6/1996 | Lerner et al. | 455/38.3 |
| 5,588,133 | 12/1996 | Yoshida et al. | 711/150 |
| 5,751,988 | 5/1998 | Fujimura | 711/5 |

*Primary Examiner*—Eddie P. Chan
*Assistant Examiner*—Hiep T. Nguyen

[57] ABSTRACT

A method and apparatus for providing serially shifted data to a plurality of registers (51 through 56) begins by providing an enable signal (14). A first time portion of the enable signal (14) is either asserted or pulsed in order to provide a bank select control signal to a bank select circuit (74). After providing the bank select information, the enable (14) is activated in order to enable the storage of serial input data within a register (40). While data is being provided via a data input (16) to the register (40), a monitoring circuit (72) is recording the number of clocks (12) required to provide the entire sequence data into the register (40). A combination of the decoding information provided by the bank select circuit (74) and the monitoring circuit (72) allows one of a plurality of registers to be written with the data from register (40) even when the registers (51 through 56) are of a same size.

27 Claims, 6 Drawing Sheets

SERIAL INTERFACE WITH REGISTER SELECTION WHICH USES CLOCK COUNTING, CHIP SELECT PULSING, AND NO ADDRESS BITS

FIELD OF THE INVENTION

The present invention relates generally to integrated circuits, and more particularly to, providing serial data to registers in a time and space efficient manner.

BACKGROUND OF THE INVENTION

In order to reduce pin count, size of packaging, and cost of integrated circuits, it is advantageous to provide data between integrated circuits using a serial interface. However, serial interfaces usually require that both address and data binary values be provided in a time sequential manner which consumes a significant amount of performance within the integrated circuits. Therefore, steps have been taken to eliminate the need for address bits in a serial peripheral interface so that a larger portion of the serial communication time period is spent communicating data rather than overhead.

One prior art technique for avoiding address bits in a serial peripheral interface (SPI) is taught by U.S. Pat. No. 5,146,577, by Babin. In this patent, data is provided by a serial data input port. This serial data provided by the serial data input port is serially shifted into a data serial shift register. While the data is being shifted into the data serial shift register, the number of clocks required to shift in the entire serial data into the data serial shift register is counted via a ripple counter. The final count value of the ripple counter can be used to determine which register is to receive the serially shifted data if all the registers within the system are of different sizes. For example, if the ripple counter contains the value of 8 at the end of a data shift sequence, and only one 8 bit register is located within the system, then it can be easily determined that the data provided in the serial shift register should be provided to the 8 bit internal register. If the ripple counter detects 16 bits and only one register in the system is 16 bits wide, then the data can be accurately routed whereby data bit counting replaces the need for address bits. Since each register has a unique number of data bits of capacity, counting the data bits determines the register which should be written to without the need for additional serially-communicated address bits.

However, when a system becomes more complex and, for example, contains two 8 bit registers (or any two registers of any same size) this clock counting methodology becomes problematic. If two or more registers or two or more sets of registers have the same size, then even if the number of data bits shifted into the system is known it is still unclear as to which of the multiple same-sized registers should receive the data. For example, when there are four 8 bit registers which require communication with the serial data input, the fact that the ripple counter produces the count of 8 is not an adequate indication to determine which of the four 8 bit registers is to receive the data.

In addition, the use of serial address communication prior to, within, or after serial data communication is disadvantageous. Many serial communication interfaces (SCIs) and serial peripheral interfaces (SPIs) require that bits be provided to the serial input in fixed quantities or packets of bits. For example, an interface may require that 8-bit segments be serially provided a whole units to the data input in order to function. This presents no problem as long as 8-bits are required to address $2^8$ registers. However, if only two registers are within the system thereby requiring only one bit of addressing, 8 bits must still be provided for addressing thereby wasting 7-out-of-8 bits on an interface that is already slow when compared to the parallel high-frequency operation of most data processors. Therefore, the avoidance of serial address decoding on data lines which require set packets or set number of bits per communication will improve performance.

Therefore, since more registers are being integrated into a single integrated circuit wherein these registers are a same size and require joint access to a serial data interface, a new method for determining which register is to receive serial shifted data needs to be developed. This new method needs to function without additional address pins and avoid the need for a serially provided address value on the data terminal due to serial peripheral interface (SPI) constraints and the desire for improved performance.

Figure 1:
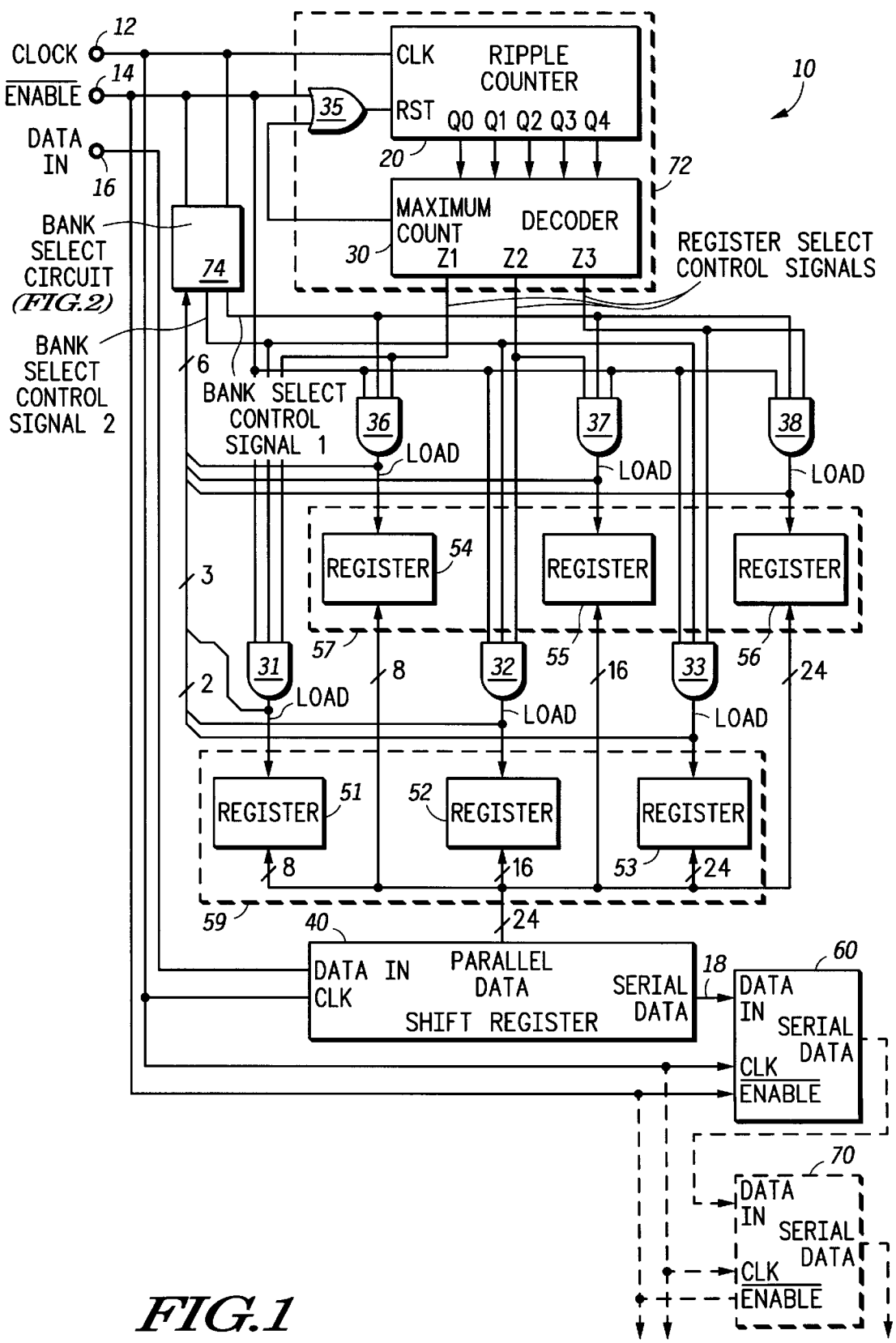
FIG. 1 illustrates, in a block diagram, a system for serially providing data to one of plurality of registers wherein two or more of the registers are of a same size in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention is an apparatus and method for providing a serial stream of data containing data bits to an appropriate register within an integrated circuit. The serial data interface taught herein can communicate serial information to a proper storage register without the need for serially transmitted address bits which are communicated along a data input before or after serial data is provided. Proper routing of the serially provided data to a storage register within the integrated circuit is performed by using a preferred two-level decode procedure. In this two-level decode methodology, a first level of decoding is performed by monitoring a binary sequence provided serially on an enable signal or chip select line. A second level of the two-level or two-dimensional decoding is performed by counting the number of data elements shifted into a shift register. By performing decoding on the enable signal while counting the clocks (or data bits) used to enter data into a serial shift register, one of a plurality of registers may be uniquely selected to receive the input data stream. These registers in the plurality of registers may be of a same size and still be selected for proper data storage via the chip select/enable signal level of decoding. Furthermore, the encoding on the chip select or enable signal is not limited to a specific size (such as the 8-bits discussed in the background) so that overhead is reduced.

In yet another form, the determination of which register is to store the serial shift data can be made by only monitoring a binary sequence serially provided on an enable line or chip select line of the serial peripheral interface (SPI). In this embodiment, the data provided on the data input is routed to a selected register in a time efficient manner wherein the registers can be of a same data size even without performing clock counting or data bit counting of the incoming stream. In some embodiments, the enable terminal or chip select terminal decoding signal can be occurring in parallel with the actual data stream coming into the part so that the only time observed in the transfer is the time it takes to transfer the serial data. In this configuration, the enable needs to be latched low by a first device when the edge is detected to enable full data capture while another device is used to continue monitoring the changing enable to capture and decode the destination.

The present invention can be further understood with reference to FIGS. 1 through 9.

FIG. 1 illustrates, in a block diagram, an electrical system which can be used to route serially shifted data within an integrated circuit (IC). FIG. 1, as illustrated in the upper right hand corner, comprises three primary input signals. A system clock is provided via a clock terminal 12 in FIG. 1 which provides a clock signal to control the latches, register, flip-flops, etc. within the system. Serial streams of data can be provided in a time serial manner via a data input terminal 16. A data enable signal is provided via an enable line 14 so that the integrated circuit is informed when valid data is being provided on the terminal 16.

The clock terminal 12 and the enable terminal 14 are coupled to a bank select circuit 74. In addition, the clock 12 and the enable terminal 14 are coupled to a monitoring circuit 72 in FIG. 1. The bank select circuit 74 and the monitoring circuit 72 provide a two-level or two-dimensional decode which determines where the serially shifted data provided by the data input terminal 16 is to be finally stored (initially, all data coming into the IC will be stored serially into register 40 of FIG. 1, then a subsequent operation will store the data via a parallel interface to a final destination register 51–56 as determined by the 2-level decode). The bank select circuit 74 detects and decodes a binary sequence serially-provided by the enable terminal 14. One example of a short binary sequence is illustrated by sequence 200 in FIG. 7. This binary sequence provided by the enable terminal 14 is detected and processed by the bank select circuit 74 to provide one or more bank select control signals as illustrated in FIG. 1. After providing the binary sequence on the enable terminal 14, serial data is provided via the data input terminal 16. This data is clocked into register 40 using the clock signal 12 as long as the enable 14 is activated (enable is active low in FIGS. 1 and 7 but could be active high in another embodiment). During this activated state wherein data is being transferred through the terminal 16, the number of clock cycles on terminal 12 used to transfer the data into the register 40 are monitored by the circuit 72.

In a first embodiment, the monitoring circuit 72 counts all of the clock cycles which are required to completely store the serial stream of data on the terminal 16 into the register 40. In other words, as long as the enable signal is active low, the number of clocks are counted in counter 20. For example, when the data provided on the data N terminal is 8 bits of data, the enable is activated until the entire 8 bits of data is provided on the terminal 16. Each of the 8 bits of data are clocked by a single clock cycle from the clock 12. Therefore, by counting the number of clock cycles which occur while the enable is activated, the monitoring circuit 72 is able to determine the number of data bits provided via the data input terminal 16.

It is important to note that, in one form, the ripple counter can be configured to count not only the data clock cycles but the serial sequence clock cycles also and still determine the proper destination register. For example, assume that the binary sequence provided by the enable 14 is two clock cycles and the data portion provided is one of 8-bits, 16-bits, or 24-bits. The counter 20 can be designed to store the values of 10, 18, or 26 (which is the data plus the decode sequence length) or can be used to store 8, 16, or 24 by ignoring the time period when binary decode sequences are provided. In either case, the end result from the decoder is the same, the counted bits allow the decoder logic 30 to determine the size of register which is to receive the data.

The number of clock signals counted by the ripple counter 20 is provided to a decoder 30 in FIG. 1. The decoder 30 then decodes the 5-bit count value from the ripple counter 20 and activates one of the decoder output signals Z1, Z2, or Z3 depending upon the count value provided by the counter 20. When enabled, the Z1 signal indicates that the data has been provided to an 8-bit register. When enabled, the Z2 signal indicates that the data has been provided to a 16-bit register. When enabled, the Z3 signal indicates that the data has been provided to a 24-bit register. Therefore, the monitoring circuit 72 provides one active output wherein one of the register select control signals are activated upon completion of a data transfer through the terminal 16. Together, the bank select control signal and the register select control signals are provided to a plurality of AND gates 31 through 33, and 36 through 38 to provide load signals to the registers 51–56. The AND gates 36 through 37 are coupled to a first bank or first set of registers 57. The AND gates 31 through 33 are coupled to a second bank or second set of registers 59. The first bank of registers 57 contains three registers, 54, 55, and 56 (three is used by way of example and more or fewer registers can be used in other embodiments). Register 54 is a register that has the capacity to store 8 bits of data. Register 55 in FIG. 1 is a register which has the capacity to store 16 bits of data. The register of 56 of FIG. 1 is a register that has the capacity to store 24 bits of data.

In one embodiment, the register 54 is an 8-bit register which is a control register for a first phase lock loop (PLL) (not illustrated) within the integrated circuit 10. In this embodiment, the load register 55 is a reference register which controls the operation of the first phase lock loop (PLL) (not illustrated) within the integrated circuit 10. Also in this embodiment, the register 56 is a voltage controlled oscillator (VCO) divider register for controlling the operation of the first phase lock loop (PLL) located on the integrated circuit 10. Therefore, the collection of three registers 54–56 are used to collectively control the operation of a first PLL within the IC in one embodiment.

The registers 51 through 53 are similar to the registers 54 through 56. For example, register 51 has the capacity to store 8 bits of data as does the register 54. The register 52 has the capacity to store 16 bits of data as does the register 55. The register 53 has the capacity to store 24 bits of data as does the register 56. Therefore, in one embodiment, the registers 51 through 53 can be used to control a second phase lock loop (PLL) circuit (not illustrated in FIG. 1) located along with the first phase lock loop circuit (not illustrated in FIG. 1) within the integrated circuit 10.

FIG. 1 illustrates the serial shift register 40 which has a serial input labeled as data in and a parallel output comprising twenty-four bits (more than 24-bits may be needed for larger registers). This shift register 40 stores the incoming time serial stream of data from the data input 16 in response to clock cycles on terminal 12. While enable is activated, serial data is provided to the register 40 via terminal 16, and the monitoring circuit 72 performs the clock counting as previously discussed to determine the number of data bits which are stored within the data shift register 40 after data shifting is completed due to enable being deactivated.

FIG. 1 illustrates additional serial data devices 60 and 70 which are coupled in series with the shift register 40. Devices 60 and 70 illustrate that many serial shift devices can be serially coupled or cascaded in series with the shift register 40. The gate 35 and the maximum count signal of decoder 30 allow this serial operation to occur.

The operation of the circuit in FIG. 1 is as follows. To begin a data transfer from the terminal 16 to one of the registers 51 through 56, the enable signal is used to initiate the transfer. First, the enable signal is asserted or toggled with a brief time-serial binary sequence (see FIG. 7). This time serial binary sequence is sensed by the bank select circuit 74 which is discussed in further detail in FIG. 2. This binary sequence selects one of either the bank 59 or the bank 57 in FIG. 1 via the bank select control signals of FIG. 1. It is important to note that although two banks are taught in FIG. 1, it is possible to extend the bank select circuit to select between more than two banks of registers by using a longer binary sequence on the enable terminal 14. After the binary sequence is provided on the enable signal 14 via bit set and bit clear instructions of a CPU, the enable signal is fully activated (i.e., not providing the binary sequence anymore but constantly active low for the duration of data input) and data is received via the terminal 16.

The data is clocked into the shift register 40 via clock cycles from the clock 12. These clock cycles 12 which are used to shift the data 16 into the shift register 40 are counted by the ripple counter 20. Once enable is deactivated, the count value of counter 20 is decoded to provide the register select control signals out from the decoder 30 in FIG. 1 and the ripple counter is reset via the NOR gate 35. At this point, the data is completely shifted into register 40 and available at the inputs of the registers 51 through 56 via the parallel interface. The providing of the bank select control signal and the register select control signals allows one of the gates 31 through 33 and 36 through 38 to be activated to provide an active load signal to one of the six registers in FIG. 1. Therefore, the decoding process in FIG. 1 is a two-dimensional or two-level decoding process since the bank select circuit 74 selects one of the two banks 57 and 59 whereas the monitoring circuit 72 selects which register within the selected bank is to be written with the data stored in the register 40.

Figure 2:
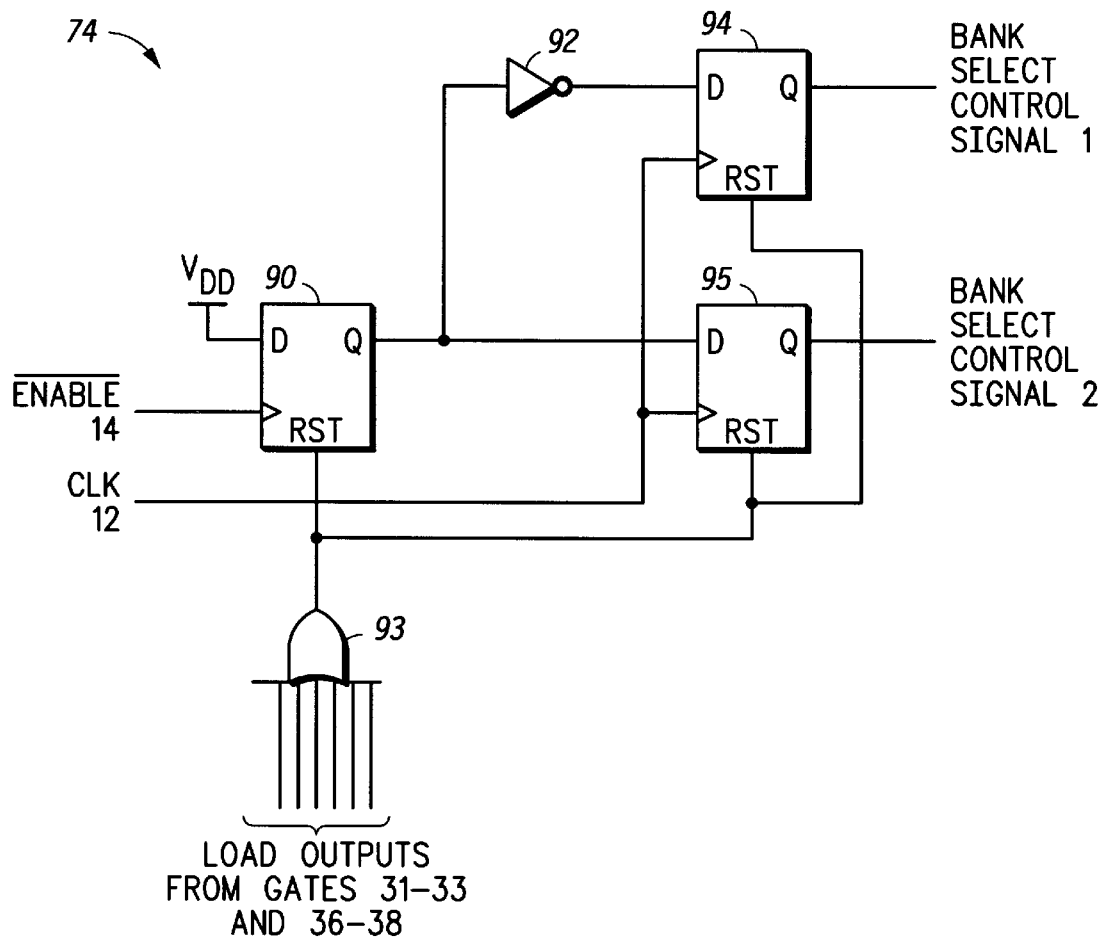
FIG. 2 illustrates, in a block diagram, a more detailed diagram of the bank select circuit of FIG. 1 in accordance with the present invention.

FIG. 2 illustrates the bank select circuit 74 of FIG. 1 in more detail. Bank select circuit 74 comprises a D flip-flop 90 and a pair of D flip-flops 94 and 95. FIG. 2 illustrates a reset OR gate 93 which receives all of the outputs of the gates 31–33 and 36–38 of FIG. 1 as OR gate inputs and provides a reset signal to the flip-flops 90, 94, and 95.

Figure 6:
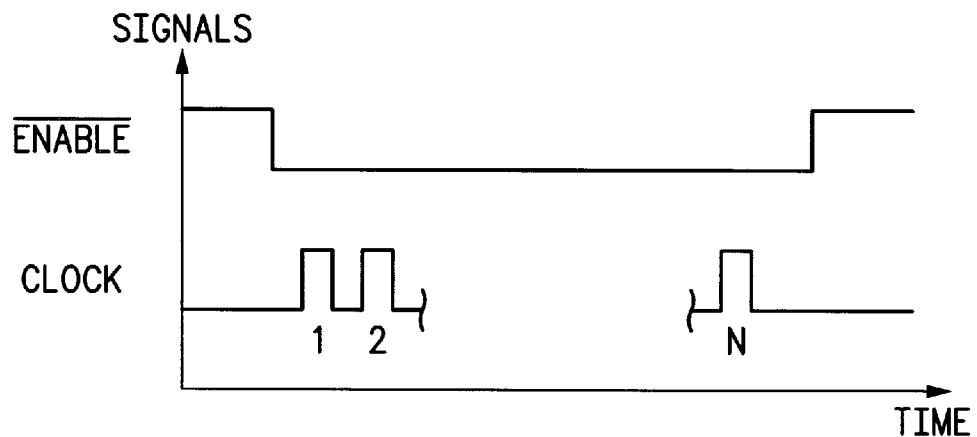
FIGS. 6 through 7 illustrate, in timing diagrams, a method of operation of the system illustrated in one or more of FIGS. 1, 3, and 4 in accordance with the present invention.

The enable sequence of FIG. 6 is used in the circuit of FIG. 2 to select bank 1 (bank 57 in FIG. 1) while keeping bank 2 (bank 59 in FIG. 1) unselected. Initially, the enable signal is inactive high in FIG. 6 and is not toggling in any manner. Furthermore, the flip-flops 90, 94, and 95 are all reset (gate 93 can be designed to reset on power-up) so that both the banks select control signals 1 and 2 are low and deactivated. In a left hand portion of FIG. 6, the enable goes active low. However, the flip-flop 90 latches the VDD value on the D input only on a rising edge of the clock input to flip-flop 90. Therefore, the output Q of the flip-flop 90 remains low (due to the previous reset) on falling edges of the enable 14. After a brief all-zero binary sequence is provided on the enable 14 to enable subsequent bank selection (bank 1 is subsequently selected by default since the flip-flop 90 is not altered), the clock 12 begins to toggle as illustrated in FIG. 6. When the clock 12 begins to toggle, a logic one is latched into flip-flop 94 while a logic zero is latched into flip-flop 95 due to the inverter 92 thereby selecting bank 1 (bank 57 of FIG. 1). Therefore, the act of clocking the data into the register 40 of FIG. 1 also selects which bank is to be written with the serially-provided data. Even though the bank is now selected, data is only written to one of registers 51–56 in response to an asserted signal from the gates 31–33 and 36–38 of FIG. 1 wherein these signals are only enabled when enable goes high (deactivated), bank select is high, and one output Z1–Z3 of decoder 30 is high. Since the enable 14 is low during clocking of the data in FIG. 6, no data is latched into any of the registers 51–56 of FIG. 1 during the serial shift data input operation to register 40 of FIG. 1 even though a bank signal is activated. The repeated toggling of the CLK 12 to input data to register 40 also continues to clock stable values into flip-flops 94 and 95. Therefore, the bank select control signals are not adversely altered during the repeated clocks associated with data shift operations into register 40 of FIG. 1.

Once the data is completely shifted into register 40 of FIG. 1, the CLK ceases to toggle. In addition, after the clock ceases to toggle, the enable is brought inactive high in a right portion of FIG. 6. At this point, enable is high, one of the banks are selected via flip-flops 94–95, and one output of the decoder 30 is active and stable. Therefore, one of the registers 54–56 of FIG. 1 are written to contain the contents of the register 40 via a positive-going edge on the "load" input of one of the registers 54–56.

Figure 7:
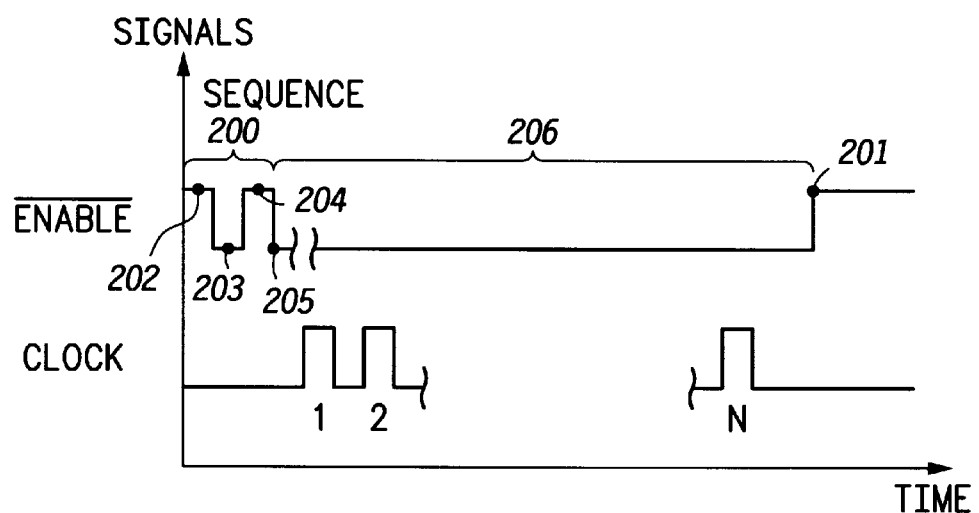

The enable sequence of FIG. 7 is used in the circuit of FIG. 2 to select bank 2 (bank 59 in FIG. 1) while keeping bank 1 (bank 57 in FIG. 1) unselected. Initially, the enable signal is inactive high in FIG. 7 and is not toggling in any manner. Furthermore, the flip-flops 90, 94, and 95 are all reset (gate 93 can be designed to reset on power-up) so that both the banks select control signals 1 and 2 are low and deactivated. In a left hand portion of FIG. 7, the enable goes active low. However, the flip-flop 90 latches the VDD value on the D input only on a rising edge of the clock input to flip-flop 90. Therefore, the output Q of the flip-flop 90 remains low (due to the previous reset) on falling edges of the enable 14 at point 203. A rising edge from point 203 to point 204 is encountered on the enable 14 in FIG. 7. This rising edge stores a logic one in the flip-flop 90. The falling edge from point 204 to point 205 of FIG. 7 does not change the logic one provided on the Q output of flip-flop 90. The clock 12 now begins to toggle to capture data into the register 40. When the clock 12 begins to toggle, a logic one is latched into flip-flop 95 while a logic zero is latched into flip-flop 94 via the inverter 92 thereby selecting bank 2 (bank 59 of FIG. 1). Therefore, the act of clocking the data into the register 40 of FIG. 1 also selects which bank is to be written with the serially-provided data. Even though the bank is now selected, data is only written to one of registers 51–56 in response to an asserted signal from the gates 31–33 and 36–38 of FIG. 1 wherein these signals are only enabled when enable goes high (deactivated), bank select is high, and one output Z1–Z3 of decoder 30 is high. Since the enable 14 is low during clocking of the data in FIG. 6, no data is latched into any of the registers 51–56 of FIG. 1 during the serial shift data input operation to register 40 of FIG. 1 even though a bank signal is now activated. The repeated toggling of the CLK 12 to input data to register 40 also continues to clock stable values into flip-flops 94 and 95. Therefore, the bank select control signals are not adversely altered during the repeated clocks associated with data shift operations into register 40 of FIG. 1.

Once the data is completely shifted into register 40 of FIG. 1, the CLK 12 ceases to toggle. In addition, after the clock 12 ceases to toggle, the enable is brought inactive high in a right portion of FIG. 6. At this point, enable is high, one of the banks are selected via flip-flops 94–95, and one output of the decoder 30 is active and stable. Therefore, one of the registers 51–53 of FIG. 1 are written to contain the contents of the register 40 via a positive-going edge on the "load" input of one of the registers 51–53. It is important to note that the outputs of the gates 31–33 and 36–38 will stay high after the positive-going register-write edge for only a short time due to a feedback path through the bank select circuit 74. The outputs of the gates 31–33 and 36–38 of FIG. 1 are provided to the OR gate 93 of FIG. 2 which quickly resets the flip-flops of FIG. 2 after the rising or positive-going edge is provided from one of gates 31–33 and 36–38 of FIG. 1. Therefore, FIG. 2 illustrates a circuit which selects between two banks of registers.

Figure 3:
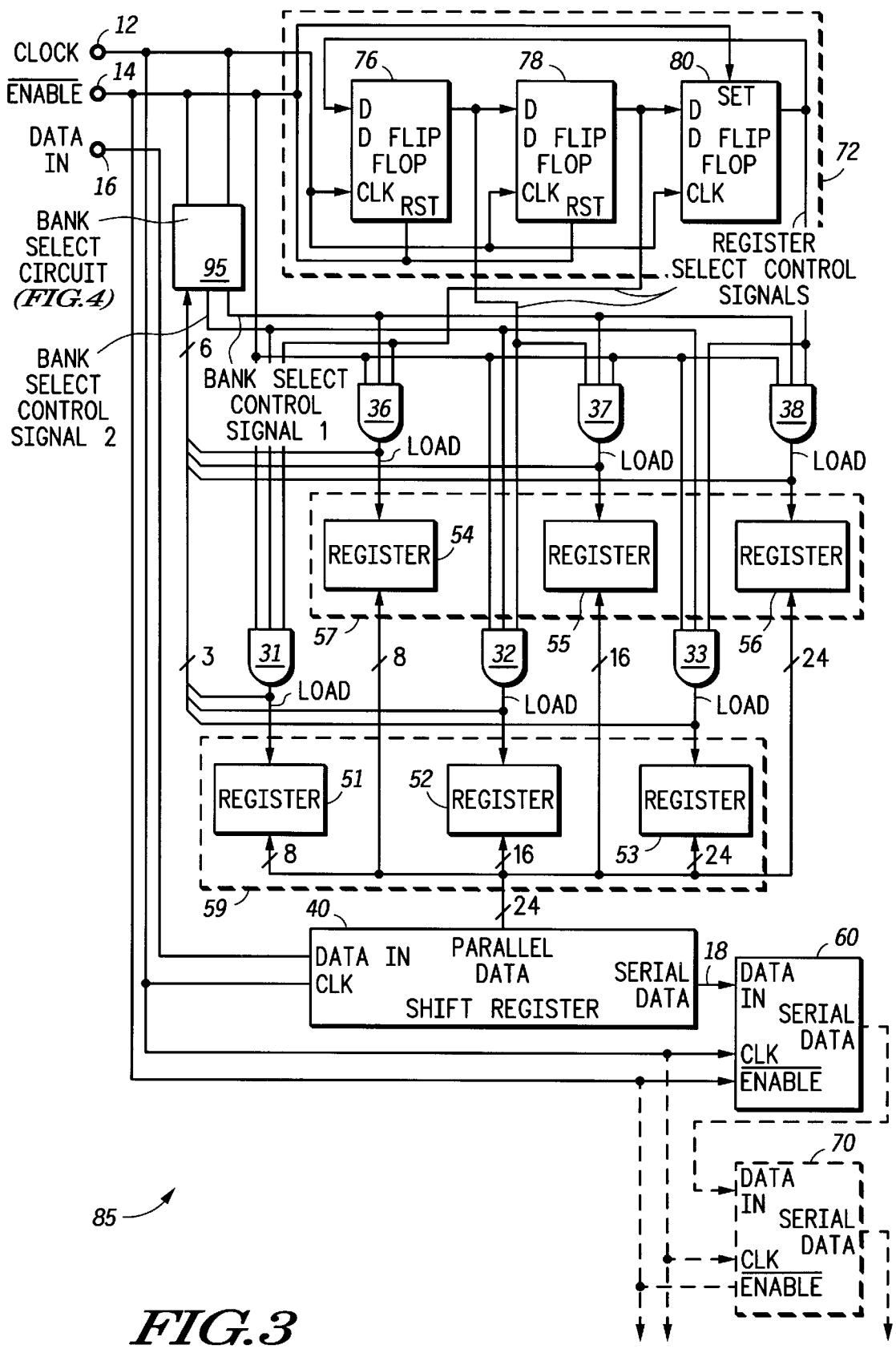
FIG. 3 illustrates, in a block diagram, an alternate embodiment of the circuit illustrated in FIG. 1 in accordance with the present invention.

FIG. 3 illustrates an alternate embodiment of the system illustrated in FIG. 1. All of the circuitry in FIG. 3 is identical to that illustrated in FIG. 1 with the exception of the contents of the monitoring circuit 72. Illustrated within monitoring circuit 72 of FIG. 3 are a plurality of flip-flops 76 through 80 which form a Johnson counter. The Johnson counter replaces the ripple counter 20, the decoder 30, and the gate 35 as illustrated in circuit 72 of FIG. 1. When the enable 14 is inactive high, the flip-flops 76 and 78 are cleared while the flip-flop 80 is set. Once the enable goes active low, the flip-flops begin to circularly rotate the set bit from the flip-flop 80 through the flip-flops 76 through 80 as clock cycles occur on terminal 12 which are latching data 16 into the register 40 and clocking the Johnson counter within circuit 72. While the bank select binary sequence is being provided by the enable 14, the Johnson counter of circuit 72 of FIG. 3 may be started and reset one or more times during the course of the binary sequence on the enable line. This starting and resetting during the binary sequence will send erratic data to the load gates 31–33 and 36–38. However, this erratic data will not matter since the signals from the bank select circuit 74 will be deactivated prevented the erratic data from going through the NAND gates 31–33 and 36–38. While the circuit 72 is processing the data bits that are coming in and changing state, the enable will be low. Therefore, after the bank selects are determined and set, the low enable signal for entering data will prevent the NAND gates 31–33 and 36–38 from passing bad load signals while the circuit 72 is processing the clock signals used to input data. Therefore, as long as enable is low, no latching will occur in registers 51–56 of FIG. 3 until enable goes high with one of the bank selects activated and one of the three outputs from the circuit 72 activated. Therefore, one of the registers 51–56 will be latched at the point 201 in FIG. 7.

For each clock cycle which is used to latch a binary bit within the register 40, the set bit initially created in register 80 will be moved circularly to the next register within the circular loop of flip-flops 76–80. For example, a first clock cycle which clocks a first data element from the terminal 16 will shift the logical 1 in register 80 to register 76. A second clock encountered on the terminal 12 which latches data 16 into the register 40 will shift this set bit from flip-flops 76 to flip-flops 78. This process continues for every clock which is used to latch a data bit within the register 40 of FIG. 3.

When an 8-bit data value is provided by the terminal 16 and latched into register 40 via 8 clocks, the set bit, initially created in flip-flops 80, will stop circulating within the flip-flops 78 of FIG. 3 (i.e., the remainder of 8/3 is 2). Therefore, the output of flip-flop 78 is used to enable storage within one of the 8 bit registers 51 and 54 as selected by the bank select circuit 74. The set bit created in flip-flops 80 will stop circulating within the flip-flops 76 when a 16 bit data value is shifted into the shift register 40 (i.e., the remainder of 16/3 is 1). Therefore, an output of the flip-flops 76 is used to enable storage into one of the 16 bit registers 52 or 55 as selected by the bank select circuit 74. Finally, the set bit initially in flip-flops 80 will be finally present within the same flip-flops 80 after a sequence of 24 data bits are shifted into the shift register 40 (i.e., the remainder of 24/3 is 0). Therefore, an output of the flip-flops 80 is used to latch data within one of the registers 53 and 56 as are selected by the bank select circuit 74. Therefore, the circuitry of FIG. 3 provides a slightly more compact solution to the two-dimensional decoding scheme introduced in FIG. 1 using counters and enable-output-latched decoders.

Figure 4:
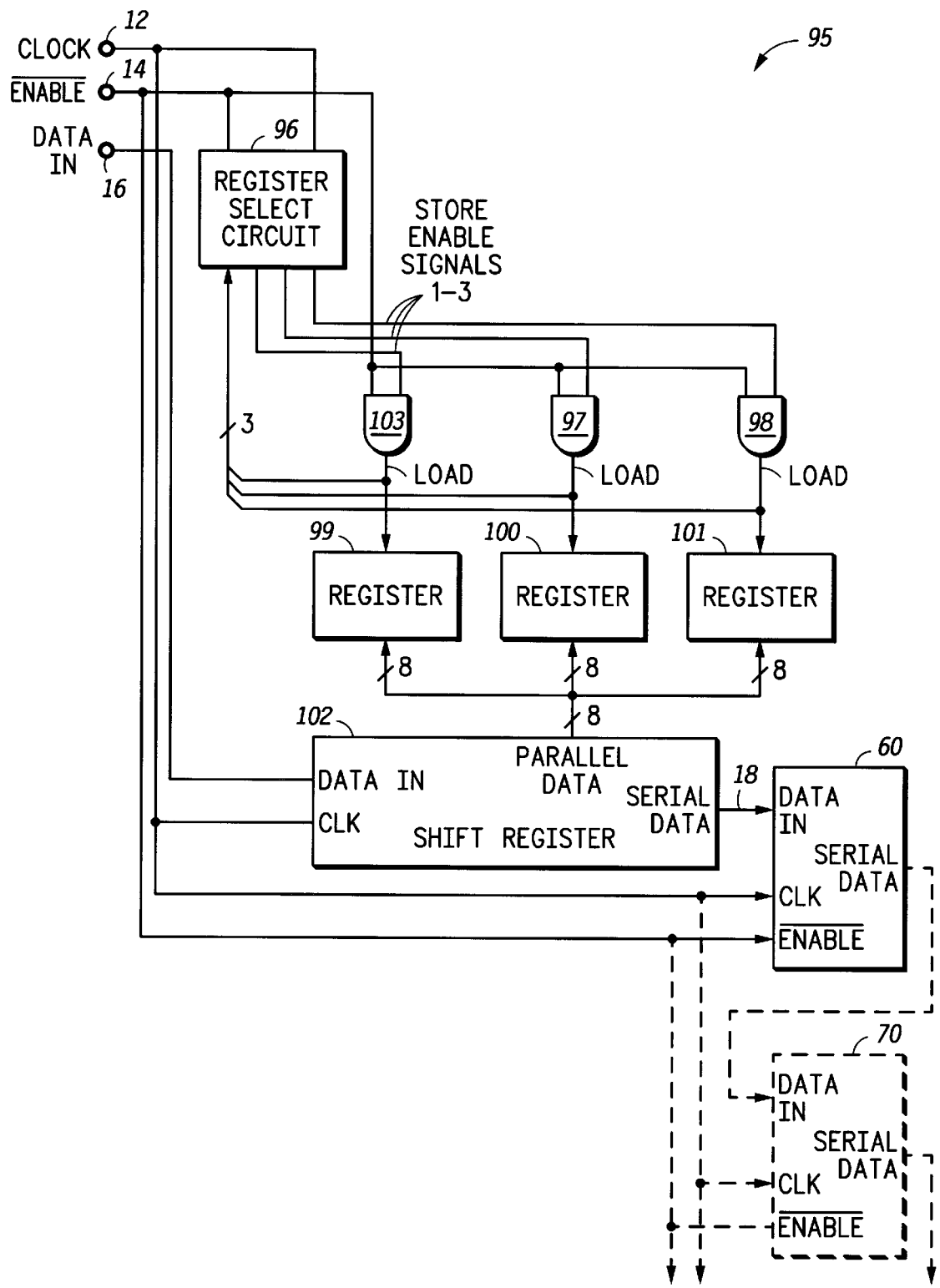
FIG. 4 illustrates in a block diagram, yet another embodiment of the system illustrated in FIGS. 1 and 3 in accordance with the present invention.

FIG. 4 illustrates yet another alternate embodiment to that illustrated in FIGS. 1 through 3. Instead of performing a two-dimensional decode sequence in using bank selection and register selection as taught in FIGS. 1 through 3, FIG. 4 teaches a single dimensional selecting process. In other words, FIG. 4 teaches that one among a plurality of registers are selected only by monitoring a binary code sequence provided serially on enable 14 whereby the circuitry of FIG. 4 does not require any circuitry in order to count data clocks or data elements which are shifted into a shift register. Therefore, there is no circuitry in FIG. 4 which is analogous to the monitoring circuitry 72 of FIGS. 1 and 3 (this circuitry is not required in FIG. 4).

FIG. 4 contains the same inputs of clock 12, enable 14, and data in 16 as illustrated in FIGS. 1 and 3. However, the monitoring circuit 72 and 74 of FIGS. 1 and 3 are replaced by a single register select circuit 96 in FIG. 4. The register select circuit 96 provides a plurality of register select control signals to each of a plurality of registers (three are illustrated in FIG. 4, however, and number of registers can be provided for by lengthening the binary sequence coming into enable 14. These control signals are provided to a plurality of AND gates 103, 97, and 98. Gates 103, 97, and 98 provide load signals to a the plurality of load registers 99 through 101. The input data terminal 16 is serially coupled to shift register 102 in a manner similar to that illustrated in FIGS. 1 and 3. In addition, the same serially coupled devices 60 and 70 are illustrated in FIG. 4 as are illustrated in FIGS. 1 and 3.

As previously mentioned, FIG. 4 teaches a one-dimensional decoding process which determines which register among the plurality of registers 99 through 101 is to store the data provided in the shift register 102. A determination of which load register is selected is made exclusively by the register select circuit 96.

Figure 5:
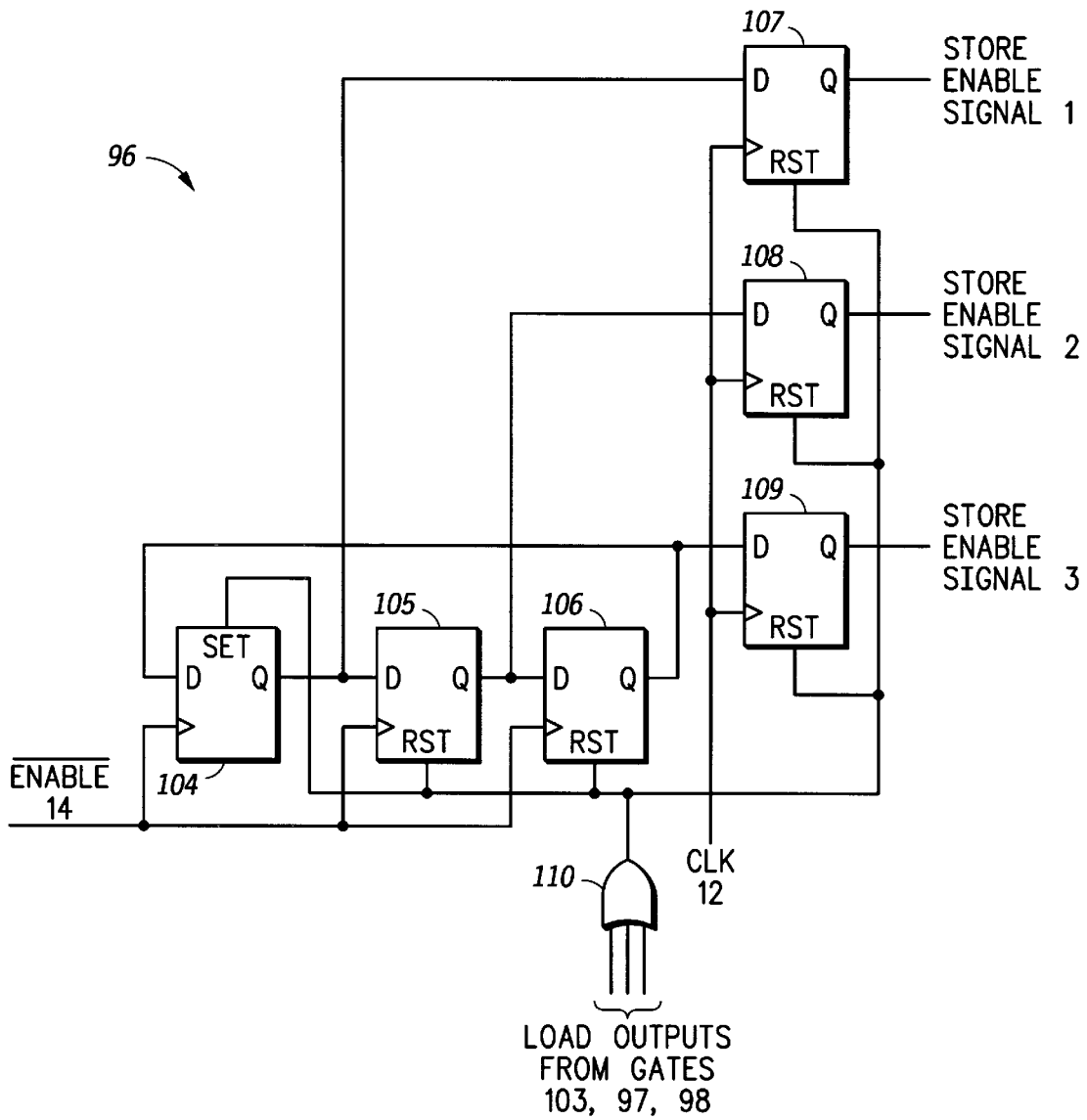
FIG. 5 illustrates, in a block diagram, the register select circuit of FIG. 4 in accordance with the present invention.

Register select circuit 96 is further illustrated in FIG. 5. The register select circuit 96 monitors the enable signal 14 to begin a data transfer by detected a specific number of rising edges on the enable 14. To begin a data transfer, the enable signal 14 provides a binary sequence before the data is provided on the data input 16. This binary sequence contains rising edges which are monitored by the circuit 96 to provide the register select control signals illustrated in FIG. 4. The circuit of FIG. 5 provides for the selection of up to three registers 99–101 as illustrated in FIG. 4.

The circuit 96 has a first set of registers 104–106 which are configured as a Johnson counter. Initially, the enable 14 will be in an idle or off state wherein enable provides a deasserted value or a logic 1 continuously. Therefore, the flip-flops 105–106 will be in is a reset state while the flip-flop 104 will be in a set state wherein this 100 state is undisturbed by the constant logic one provided by enable 14. In order to begin the encoding, a zero is first provided on the encode line 14. This zero is followed by zero through two rising edges. If zero rising edges on the enable 14 are detected, the flip-flop 104 retains the logic one. If one rising edge is detected, the flip-flop 105 will contain the only logic one among the three flip-flops 104–106. If two rising edges are detected, the flip-flop 106 will contain the only logic one among the three flip-flops 104–106. The flip-flop which contains the logic one will determine which of three registers 99–101 of FIG. 4 are selected for writing by latching one enabled logic one into the flip-flops 107–109 which are analogous to the flip-flops 94–95 of FIG. 2.

Therefore, FIG. 5 shows a circuit which can be used for selectively loading data into the three registers 99–101 of FIG. 4 or can be used for a more complex circuit than FIG. 4 by using more flip-flops. In general, the binary sequence (rising edges) provided initially by the enable 14 selects which register is to store the final data serially shifted into shift register 102.

Shown in FIG. 6 is a timing diagram including the enable 14 and clock 12. The enable 14 stays low for the entire duration of N clock cycles needed to provided a proper length data value to the shift registers taught herein. For example, N=8 for an 8-bit data value, N=24 for a 24 bit data value, etc.. FIG. 6 was used hereinabove in order to describe the operation of one or more of FIGS. 1–5.

Shown in FIG. 7 is a timing diagram including the enable 14 and clock 12. Since serial addressing on a data line is not possible given many SPI and SCI constraints, an encoding sequence 200 is provided on the enable line 14 prior to a data receipt phase 206. During the occurrence of the enable sequence 200, the values located at one or more of points 202, 203, 204, 205, etc. are latched and processed as taught herein in one of three embodiments illustrated in FIGS. 1–2, FIG. 3, or FIGS. 4–5. The FIG. 7 is used hereinabove to describe the circuitry within FIGS. 1–5.

Thus it is apparent that there has been provided, in accordance with the present invention, a method and apparatus for serially scanning data into an IC. Although the invention has been described and illustrated with reference to the specific embodiment, it is not intended that the invention be limited to these illustrative embodiments. Those skilled in the art will recognize that modifications and variations may be made with departing from the spirit and scope of the invention. For example, 8-bit, 16-bit, and 24-bit registers are discussed herein, however, any sized register can be used herein. The registers taught herein can be used for any function. The registers taught herein can be configured into any number of banks, etc.. A Johnson counter is taught herein, however, this counter may be replaced with a grey code counter, a binary counter, a state machine, or other circuitry. Therefore, it is intended that this invention encompass all variations and modifications as fall within the scope of the appended claims.

What is claimed is:

1. A method for selecting a register storage destination for a serially-provided data stream, the method comprising the steps of:

providing a first set of registers, the first set of registers comprising a first register of a bit length N wherein N is a finite positive integer and a second register of a bit length M wherein M is a finite positive integer such that N≠M;

providing a second set of registers, the second set of registers comprising a first register of the bit length N and a second register of the bit length M;

providing an enable signal, the enable signal being selectively pulsed to allow for selection of one of either the first set of registers or the second set of registers, a selected one of either the first set of registers or the second set of registers being a selected set of registers; and providing the serially-provided data stream wherein a number of bits within the serially-provided data stream is detected, the number of bits within the serially-provided data stream identifying a selected register within the selected set of registers to be written to contain the serially-provided data stream.

2. The method of claim 1 wherein the step of providing the serially-provided data stream comprises:

monitoring the number of bits within the serially-provided data stream by counting a number of clock pulses used to provide the serially-provided data stream.

3. The method of claim 1 wherein the step of providing the serially-provided data stream comprises:

monitoring the number of bits within the serially-provided data stream by using a circular shift register whereby, after input shifting of the serially-provided data stream, a position of an enabled bit in the circular shift register determines the selected register within the selected set of registers.

4. The method of claim 1 wherein the steps of providing a first and second set of registers further comprises:

providing a third register within the first set of registers, the third register having a bit length L wherein L is a finite positive integer such that L≠N≠M; and providing a third register within the second set of registers, the third register having the bit length L.

5. The method of claim 1 wherein the steps of providing a first and second set of registers comprises:

providing the first register within the first set of registers as a first configuration register (C); and providing the first register within the second set of registers as a second configuration register (C).

6. The method of claim 5 wherein the steps of providing a first and second set of registers comprises:

providing the second register within the first set of registers as a first reference register (R); and providing the second register within the second set of registers as a second reference register (R).

7. The method of claim 5 wherein the steps of providing a first and second set of registers comprises:

providing the second register within the first set of registers as a first voltage controlled oscillator (VCO) divider register (N); and providing the second register within the second set of registers as a second voltage controlled oscillator (VCO) divider register (N).

8. The method of claim 1 wherein the steps of providing a first and second set of registers comprises:

providing the first register within the first set of registers as a first reference register (R); and providing the first register within the second set of registers as a second reference register (R).

9. The method of claim 1 wherein the steps of providing a first and second set of registers comprises:

providing the first register within the first set of registers as a first voltage controlled oscillator (VCO) divider register (N); and providing the first register within the second set of registers as a second voltage controlled oscillator (VCO) divider register (N).

10. A method for selecting a register storage destination for a serially-provided data stream, the method comprising the steps of:

providing a plurality of registers;

providing an enable signal, the enable signal being selectively pulsed for a time duration to provide a binary sequence of ones and zeros before the serially-provided data stream is provided;

decoding the binary sequence to determine a selected register among the plurality of registers;

providing the serially-provided data stream wherein the enable signal enables the receipt of the serially-provided data stream; and storing the serially-provided data stream into the selected register as selected by the binary sequence of ones and zeros.

11. The method of claim 10 wherein the step of providing a plurality of registers comprises:

providing two configuration registers within the plurality of registers wherein the binary sequence is used to determine which of the two configuration registers, if any, is to be written with the serially-provided data stream.

12. The method of claim 10 wherein the step of providing a plurality of registers comprises:

providing two reference registers within the plurality of registers wherein the binary sequence is used to determine which of the two reference registers, if any, is to be written with the serially-provided data stream.

13. The method of claim 10 wherein the step of providing a plurality of registers comprises:

providing two voltage controlled oscillator (VCO) divider registers within the plurality of registers wherein the binary sequence is used to determine which of the two voltage controlled oscillator (VCO) divider registers, if any, is to be written with the serially-provided data stream.

14. The method of claim 10 wherein the step of providing a plurality of registers comprises:

providing a voltage controlled oscillator (VCO) divider register, a reference register, and a configuration register within the plurality of registers wherein the binary sequence is used to determine which register within the plurality of registers is to be written with the serially-provided data stream.

15. A circuit comprising:

a monitoring circuit having a first input for receiving a clock signal, a second input for receiving an enable signal, and outputs for providing register select signals;

a bank select circuit for receiving the enable signal and providing at least one bank select signal, the bank select circuit comprising a plurality of bit storage elements;

a plurality of registers configured into one or more banks whereby each register in the plurality of registers is selected by a combination of the enable signal, the at least one bank select signal from the bank select circuit, and the register select signals from the monitoring circuit;

a data serial shift register coupled to a data input for receiving a serial stream of data; and circuitry for receiving the at least one bank select signal and the register select signals and providing at least one storage control signal to the plurality of registers wherein one register among the plurality of registers is selected to store data provided by the data serial shift register.

16. The circuit of claim 15 wherein the monitoring circuit contains a ripple counter which monitors a number of clock cycles used to provide the data, the number of clock cycles used to provide the data being used to determine which register among the plurality of registers is selected to store the data provided by the data serial shift register.

17. The circuit of claim 15 wherein the monitoring circuit contains a control serial shift register which shifts a shift bit in a circular manner, a position of the shift bit in the control serial shift register determining which register among the plurality of registers is selected to store the data provided by the data serial shift register.

18. The circuit of claim 15 wherein the monitoring circuit contains a decoder for decoding control signals to determine which register among the plurality of registers is selected to store the data provided by the data serial shift register.

19. The circuit of claim 15 wherein the plurality of registers contains two configuration registers for configuring an operation of an integrated circuit comprising the plurality of registers.

20. The circuit of claim 19 wherein the integrated circuit is further characterized as comprising a first phase lock loop and a second phase lock loop, wherein a first bank of registers control an operation of the first phase lock loop and a second bank of registers control an operation of the second phase lock loop.

21. The circuit of claim 15 wherein the plurality of registers contains two voltage controlled oscillator (VCO) divider registers which is used to set a tuning frequency.

22. The circuit of claim 15 wherein the plurality of registers contains two reference registers each of which are used to set a channel spacing of a frequency band.

23. A circuit comprising:

a register select circuit for receiving an enable signal, the enable signal providing a time-serial binary sequence of logic ones and logic zeros before serial data is provided by a data input, the time-serial binary sequence of logic ones and logic zeros being processed by the register select circuit to provide a plurality of register store enable signals;

a serial shift register coupled to the data input for receiving a serial stream of data from the data input in response to an active state of the enable signal occurring after the time-serial binary sequence of logic ones and logic zeros; and a plurality of registers coupled to receive data from the serial shift register and coupled to receive the plurality of register store enable signals, whereby one of the plurality of register store enable signals is enabled from the register select circuit in response to the time-serial binary sequence of logic ones and logic zeros so that the serial stream of data stored in the serial shift register is provided to a selected register within the plurality of registers.

24. The circuit of claim 23 wherein the plurality of registers contains two voltage controlled oscillator (VCO) divider registers which is used to set a tuning frequency.

25. The circuit of claim 23 wherein the plurality of registers contains two configuration registers for configuring an operation of an integrated circuit coupled to the plurality of registers.

26. The circuit of claim 23 wherein the plurality of registers contains two reference registers which are each used to set a channel spacing of a frequency band.

27. A method for selecting a register storage destination for a serially-provided data stream, the method comprising the steps of:

provinding a series of logic ones and logic zeros on an enable signal;

providing a plurality of data bits having a bit length;

decoding the series of logic ones and logic zeros on the enable signal and using the bit length of the plurality of data bits to perform a two-dimensional decode operation to select the one register storage destination among a plurality of storage destinations.

* * * * *